US009362249B2

(12) United States Patent
Yasuhara et al.

(10) Patent No.: US 9,362,249 B2
(45) Date of Patent: Jun. 7, 2016

(54) SILVER—GOLD ALLOY BONDING WIRE

(71) Applicant: TANAKA DENSHI KOGYO K.K., Chiyoda-ku, Tokyo (JP)

(72) Inventors: Kazuhiko Yasuhara, Saga-ken (JP); Nanako Maeda, Saga-ken (JP); Junichi Okazaki, Saga-ken (JP); Jun Chiba, Saga-ken (JP); Wei Chen, Saga-ken (JP); Yuki Antoku, Saga-ken (JP)

(73) Assignee: TANAKA DENSHI KOGYO K.K., Tokyo (JP)

( * ) Notice: Subject to any disclaimer, the term of this patent is extended or adjusted under 35 U.S.C. 154(b) by 0 days.

(21) Appl. No.: 14/619,736

(22) Filed: Feb. 11, 2015

(65) Prior Publication Data
US 2016/0093586 A1 Mar. 31, 2016

(30) Foreign Application Priority Data

Sep. 26, 2014 (JP) .................................. 2014-196419

(51) Int. Cl.
*H01L 23/00* (2006.01)
(52) U.S. Cl.
CPC ........... *H01L 24/45* (2013.01); *H01L 2224/456* (2013.01); *H01L 2224/45139* (2013.01); *H01L 2224/45144* (2013.01); *H01L 2924/0102* (2013.01); *H01L 2924/013* (2013.01); *H01L 2924/01006* (2013.01); *H01L 2924/2064* (2013.01)

(58) Field of Classification Search
CPC ....................................................... H01L 24/45
USPC .......................................................... 174/126
See application file for complete search history.

(56) References Cited

U.S. PATENT DOCUMENTS

| 2009/0072399 | A1 | 3/2009 | Terashima et al. | |
| 2009/0188696 | A1* | 7/2009 | Uno ..................... | B23K 20/004 174/126.2 |
| 2012/0263624 | A1* | 10/2012 | Chiba ........................ | C22C 5/06 420/505 |
| 2015/0137391 | A1* | 5/2015 | Bez ........................ | H01L 23/053 257/784 |

FOREIGN PATENT DOCUMENTS

CN 102912176 A 2/2013
JP H11-288962 A 10/1999

OTHER PUBLICATIONS

Taiwan Patent Office, Office Action for Taiwanese Patent Application No. 104103689, Oct. 23, 2015.

* cited by examiner

*Primary Examiner* — Timothy Thompson
*Assistant Examiner* — Charles Pizzuto
(74) *Attorney, Agent, or Firm* — Manabu Kanesaka

(57) ABSTRACT

The silver-gold alloy bonding wire of the present invention includes an alloy composed of not lower than 10% and not higher than 30% of gold (Au) and not lower than 30 ppm and not higher than 90 ppm of calcium (Ca) with the remainder of silver (Ag) at purity relative to a metallic element except for elements Au and Ca of 99.99% or higher, in mass percentage; a layer enriched with oxygen (O) and calcium (Ca) formed as a surface layer on the surface of the alloy; and a gold-enriched layer formed immediately below the surface layer.

5 Claims, 2 Drawing Sheets

SILVER—GOLD ALLOY BONDING WIRE

RELATED APPLICATIONS

The present application is based on, and claims priority from, Japanese Application No. JP2014-196419 filed Sep. 26, 2014, the disclosure of which is hereby incorporated by reference herein in its entirety.

FIELD OF THE INVENTION

The present invention relates to a silver-gold alloy bonding wire suitable for connecting an IC chip electrode to an external lead or the like on a substrate in a semiconductor device, particularly a silver-gold alloy bonding wire for use under a high temperature environment such as in high-intensity LEDs, power semiconductors, and automobiles.

BACKGROUND OF THE INVENTION

Conventionally, connection between an IC chip electrode and an external lead in a semiconductor device such as ICs and LSIs is formed by a bonding wire with a diameter of about 20 to 50 μm. As a bonding wire, a fine wire made of a 4-N (99.99% by mass) pure gold alloy that is a metal generally having excellent electrical conductivity is largely used. Recently, fabricated semiconductor devices are demanded to have higher packaging density and be smaller and thinner, for example, and therefore there has been a growing trend toward finer gold alloy bonding wires with a diameter of not greater than 25 μm or even not greater than 20 μm. In addition, as cost reduction is sought, use of silver alloy bonding wires instead of gold alloy bonding wires has been studied. The diameter of such a silver alloy bonding wire is greater than the diameter of a gold alloy bonding wire and is generally around 30 μm.

Generally, bonding of a silver-gold alloy bonding wire is carried out as in the case of a gold alloy bonding wire. In other words, the method called ball bonding is employed for first bonding of a silver-gold alloy bonding wire to an electrode such as one mentioned above, and the method called wedge bonding is employed for second bonding of the silver-gold alloy bonding wire to a wire on a semiconductor wiring circuit board such as one mentioned above.

Ball bonding as the first bonding is performed by forming a free air ball (FAB) to apply arc welding heat input to the tip of a silver-gold alloy bonding wire so as to melt the tip, allowing the molten ball to solidify due to surface tension so as to form a ball called an initial ball at the tip of the silver-gold alloy bonding wire, and then applying heat to the initial ball and the electrode to a temperature ranging from 150 to 300° C., followed by pressing into adherence with ultrasonic energy applied thereto so as to form bonding.

Wedge bonding as second bonding is performed by directly heating a silver-gold alloy bonding wire to a temperature ranging from 150 to 300° C. and then, with ultrasonic energy applied thereto, pressing the silver-gold alloy bonding wire into adherence to the wiring on a wiring circuit board that has been heated to a certain temperature so as to bond the silver-gold alloy bonding wire to the wiring. Subsequently to the bonding of the silver-gold alloy bonding wire to an electrode or the wiring, the workpiece is subjected to a so-called resin molding step in which a thermosetting epoxy resin and/or a thermosetting organic silicone resin is injected onto the workpiece so as to solidify them altogether, and thus a packaged semiconductor device is obtained.

Conventionally, various silver-gold alloy bonding wires made of silver-gold alloys are developed. For example, Japanese Patent Application Publication No. 11-288962 (JP 11-288962 A) (Patent Document 1 to be listed below) has for its object to "provide an Ag alloy bonding wire that can contribute to cost reduction of semiconductor devices and is highly reliable in its bonding to chips and external leads (paragraph 0005)" and discloses in Example 20 a silver-gold alloy bonding wire that is produced by melting and casting an Ag alloy of "40.0% by weight of Au, 0.0005% by weight of Ca, and 0.0005% by weight of Ge, with the remainder being made up of Ag" and then drawing the resulting lump.

Japanese Patent Application Publication No. 2009-33127 (JP 2009-33127 A) (Patent Document 2 to be listed below) discloses that "a (silver-gold alloy) bonding wire can be produced by a method that includes after measuring weights of highly pure Au and highly pure Ag as starting materials, heating and melting them in a high vacuum or in an inert atmosphere such as nitrogen and Ar, and drawing the resulting ingot using a metal die into the diameter of the final core (paragraph 0036) . . . . (omitted) . . . , such a bonding wire with an Ag content of 55 to 90% by mass has low electrical resistance and therefore is suitable for use in a device that is required to exhibit fast response properties. In addition, with the Ag content being within this range, the Au usage can be significantly reduced and therefore the cost for Au that is available at a rising price can also be reduced (paragraph 0040)." The gold (Au) content in this disclosure is set high so as to prevent silver (Ag), which otherwise readily binds to atmospheric sulfur (S) and forms sulfides, from forming sulfides.

A resin-sealed silver-gold alloy bonding wire, however, is less resistant to thermal shock than a gold alloy bonding wire and therefore has not yet been practically used in packaged semiconductors. Especially in semiconductors subjected to high temperatures, such as semiconductors in high-intensity LEDs and automobiles, high heat load tends to be applied and therefore a silver-gold alloy bonding wire with poor thermal shock resistance has not been used. In other words, a silver-gold alloy bonding wire that is more adhesive to a molding resin such as organic silicone resins and epoxy resins than a gold alloy bonding wire has a problem that it breaks at the ball neck and the like in a first bonding and/or at the site bonded by a second bonding as the molding resin expands and contracts.

A silver-gold alloy bonding wire, as in the case of a gold alloy bonding wire, is subjected to continuous drawing and ordinary tempering heat treatment and is then wound around a spool. When wound around a spool, the silver-gold alloy bonding wire that has a low melting point and contains highly pure gold (Au) and silver (Ag) adheres to itself, which presents a problem.

CITATION LIST

Patent Literature

[Patent Document 1] Japanese Patent Application Publication No. 11-288962 (JP 11-288962 A)
[Patent Document 2] Japanese Patent Application Publication No. 2009-33127 (JP 2009-33127 A)

Technical Problem

The present invention has been made to solve the problem above and has an object to provide a highly pure silver-gold alloy bonding wire that has excellent thermal shock resistance after sealed with resin compared to a silver-gold alloy bonding wire having a conventional composition. The present invention has another object to provide a silver-gold alloy bonding wire that is smoothly unwound from a spool.

The present invention includes a layer enriched with oxygen and calcium (Ca) on the surface of a silver-gold alloy bonding wire so as to decrease the area of the bonding wire surface on which metal is exposed, for the purpose of facilitating smooth unwinding of the bonding wire and improving the fluidity of a molding resin on the bonding wire. In addition, the present invention includes a gold-enriched layer formed immediately below the surface layer of the silver-gold alloy bonding wire so as to stop penetration of sulfur (S) and oxygen, for the purpose of preserving the same properties as the properties of conventional bonding wires.

In order to achieve the objects above, the inventors of the present invention use, for the surface properties of the silver-gold alloy bonding wire, the properties of silver (Ag) to be more readily affected by sulfur (S), a trace amount of halogen substances, and the like in the atmosphere than gold (Au) and therefore be susceptible to chemical changes. Specifically, the cooling process in melting and casting of the silver-gold alloy is extended by employing continuous casting or the like so as to form a silver (Ag)-enriched layer as the outermost layer of an ingot. Such a silver (Ag)-enriched layer is not formed by conventional techniques where a silver-gold alloy is cast into a copper mold or a cooled carbon mold.

It was found that the presence of this silver (Ag)-enriched layer allowed a trace amount of calcium (Ca) that had been added to the silver-gold alloy to be concentrated on the wire surface. Namely, calcium (Ca) on the surface of an ingot binds to atmospheric oxygen to be fixed as calcium oxide, calcium (Ca) in the silver (Ag)-enriched layer is attracted by atmospheric oxygen to be oxidized on the surface of the ingot, and the silver (Ag)-enriched layer is replenished with calcium (Ca) from inside the silver-gold alloy; and a series of the reactions occur repeatedly so that a layer enriched with oxygen and calcium (Ca) builds up on all over the surface of the wire with reduced diameter. In other words, a layer enriched with oxygen and calcium (Ca) is formed on the surface of the alloy.

In the case of a conventional gold alloy, however, even though calcium (Ca) is oxidized on the surface thereof, oxygen does not reach the interior of the gold alloy and therefore calcium (Ca) contained in the gold alloy does not undergo internal oxidation. Because calcium (Ca) contained in the gold alloy does not segregate in the gold matrix, the amount of calcium oxide on the surface of the conventional gold alloy does not increase. Or, in the case of a silver alloy that has a low gold (Au) content, calcium (Ca) contained in the silver alloy does not segregate in the silver matrix, but instead oxygen permeates through the silver matrix and therefore calcium (Ca) contained in the silver matrix undergoes internal oxidation and is thus fixed. Namely, calcium oxide resulting from oxidation on the surface is fixed on the surface of the silver alloy, while calcium oxide resulting from internal oxidation is fixed in the interior of the silver matrix and therefore does not segregate to the surface, and as a result, the amount of calcium oxide on the surface of the silver alloy does not increase and therefore no calcium (Ca)-enriched layer is formed.

SUMMARY OF THE INVENTION

The silver-gold alloy bonding wire according to the first aspect of the invention that is devised so as to achieve the objects of the present invention is:

a silver-gold alloy bonding wire comprising;

an alloy composed of not lower than 10% and not higher than 30% of gold (Au) and not lower than 30 ppm and not higher than 90 ppm of calcium (Ca) with the remainder being made up of silver (Ag) at purity relative to a metallic element except for elements Au and Ca of 99.99% or higher, in mass percentage, a layer enriched with oxygen and calcium (Ca) formed as a surface layer on the surface of the alloy, and a gold-enriched layer formed immediately below the surface layer.

The general mechanical properties such as the loop properties and the leaning properties of a bonding wire are proportional to the third power of the diameter of the bonding wire, and therefore the composition of the silver-gold alloy used in the silver-gold alloy bonding wire according to the present invention is selected as above to give a strong, tough bonding wire. The adhesion to and the fluidity of a molding resin are proportional to the second power of the wire diameter and also significantly depend on the surface profile of the wire, and therefore the structure described above is selected.

DETAILED DESCRIPTION OF THE INVENTION

Figure 1:
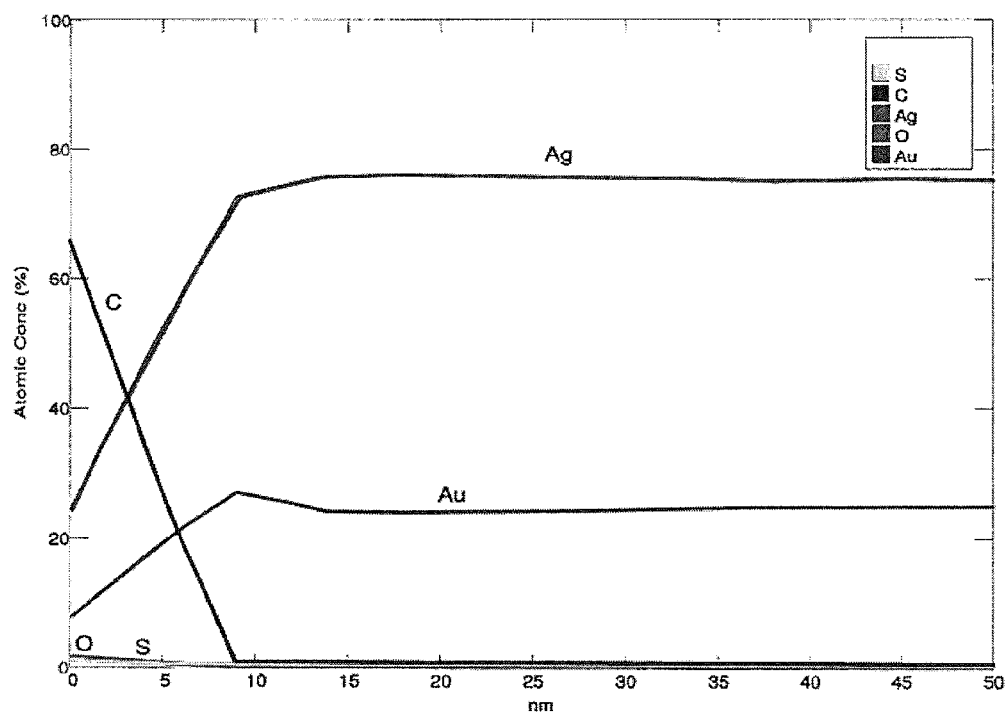
FIG. 1 shows Auger analysis of the bonding wire of the present invention in the depth direction.

The silver-gold alloy bonding wire according to the present invention contains gold (Au) preferably not lower than 15% and not higher than 25%, and more preferably not lower than 18% and not higher than 23% in mass percentage.

The silver-gold alloy bonding wire according to the present invention preferably has a carbon layer immediately over the surface layer.

In the silver-gold alloy bonding wire according to the present invention, the gold (Au) content in the gold-enriched layer is preferably higher than the gold (Au) content in the surface layer by 10% or more.

In the silver-gold alloy bonding wire according to the present invention, the thickness of the surface layer is preferably smaller than 10 nm.

The silver-gold alloy bonding wire according to the present invention has a diameter of preferably not greater than 30 μm, and more preferably not greater than 25 μm. The diameter of the silver-gold alloy bonding wire can be selected, as needed, depending on the applications such as LEDs.

In order to inhibit an increase in the electrical resistivity and reduce unwanted oxidizable matter left after melting and casting, silver (Ag) and gold (Au) as the materials of the silver-gold alloy bonding wire according to the present invention are required to be highly pure, that is, at purity of 99.99% or higher. Because of this, the purity of the silver (Ag) in the alloy is set at 99.99% or higher relative to a metallic element except for gold (Au) and calcium (Ca).

It is further preferable to use silver (Ag) and gold (Au) that have even higher purities of 99.999% by mass. This is because the higher the purities of the silver (Ag) and the gold (Au) in the silver-gold alloy are, the more likely a silver-enriched layer having a thickness of about 10 nm to form on the surface of the silver-gold alloy bonding wire after continuous casting or the like of the silver-gold alloy. On the other hand, when an ingot is produced using a commonly-used copper mold or a water-cooled carbon mold, the ingot undergoes rapid cooling and therefore no silver-enriched layer of about 10-nm thickness is formed on the surface of the silver-gold alloy bonding wire.

Gold (Au) is an element that improves the sulfidation resistance of the silver-gold alloy bonding wire and can prevent sulfidation of the silver-gold alloy bonding wire when added at 10% by mass or higher. As the gold (Au) content increases, however, the electrical resistance of the silver-gold alloy bonding wire increases. It is found that a silver-gold alloy bonding wire containing not lower than 10% and not higher than 30% of gold (Au) has a gold-enriched layer formed immediately below the surface layer and the gold-enriched layer stops penetration of sulfur (S) and oxygen therebeyond. A battery is supposedly formed between the surface layer and the gold-enriched layer. Therefore, the gold (Au) content is set at not lower than 10% and not higher than 30% and, from the practical viewpoint, preferably at not lower than 15% and not higher than 25% and more preferably at not lower than 18% and not higher than 23%.

Calcium (Ca) is selected as an additive element because calcium (Ca), when a silver (Ag)-enriched layer is present, reacts with atmospheric oxygen to form a layer enriched with oxygen and calcium (Ca) on the surface of the silver-gold alloy bonding wire. As explained above, calcium (Ca), which is a well-known additive element in a gold bonding wire, does not react with atmospheric oxygen when the calcium (Ca) is in the gold matrix. Similarly, calcium (Ca) in a silver matrix undergoes internal oxidation but does not form an enriched layer as the surface layer.

The presence of a layer enriched with oxygen and calcium (Ca) on the surface of the silver-gold alloy bonding wire of the present invention is confirmed by the presence of a carbon layer immediately over the surface layer. The presence of the carbon layer is still detected after the silver-gold alloy bonding wire of the present invention is immersed in a dilute surfactant solution and then washed with water, but the presence of a carbon layer is not detected when a pure gold alloy bonding wire with purity of gold of 99.999% by mass or a silver alloy bonding wire with purity of silver of 99.999% by mass is immersed in a dilute surfactant solution and then washed with water. This suggests that a carbon layer is anchored because of the presence of the layer enriched with oxygen and calcium (Ca). The presence of the layer enriched with oxygen and calcium (Ca) impairs the general mechanical properties such as the loop properties and the leaning properties of the bonding wire, and therefore the thickness of the surface layer is preferably smaller than 10 nm.

The calcium (Ca) content is set at not lower than 30 ppm and not higher than 90 ppm so as to prevent the surface of the silver-gold alloy bonding wire with a diameter of even as small as 20 μm or smaller from peeling off in a thermal shock test performed after a molding process. To prevent the surface of the wire from peeling off, a layer enriched with oxygen and calcium (Ca) of a certain thickness is needed to form on the surface of the wire, and this requires the calcium (Ca) content to be at least not lower than 30 ppm. When the calcium (Ca) content exceeds 90 ppm, the bonding wire becomes rigid and therefore easily breaks while being thinned. The calcium (Ca) content is preferably not lower than 40 ppm and not higher than 60 ppm.

To prevent the silver-gold alloy bonding wire from breaking, the diameter thereof is preferably not greater than 30 μm and more preferably not greater than 25 μm.

Advantageous Effects of Invention

The silver-gold alloy bonding wire according to the present invention is suitable as a silver-gold alloy bonding wire for use in packages of LEDs and the like and has excellent thermal shock resistance after sealed with resin. In addition, the silver-gold alloy bonding wire according to the present invention is smoothly unwound from a spool even after being left at a high temperature.

EXAMPLES

Examples of the present invention will be described. Highly pure silver (Ag) and gold (Au) at purity of 99.999% by mass or higher were used as the materials of a silver-gold alloy bonding wire. The highly pure silver (Ag) and gold (Au) were combined at a composition shown in the left columns of Table 1 and were then melted in an inert atmosphere. The resulting molten metal was subjected directly to continuous casting to give a semi-finished silver-gold alloy wire with a diameter of 10 mm.

The resulting semi-finished silver-gold alloy wire was drawn in the atmosphere into a predetermined diameter of 2 mm and was then subjected to intermediate heat treatment at 600° C., with the wire of Example 1 further subjected to wet continuous drawing into a diameter of 25 μm and then to tempering heat treatment at 500° C. The resultant was subjected to Auger analysis in the depth direction from the surface to the center of the wire. The apparatus used for the analysis was a scanning Auger electron microscope, MICRO-LAB-310D, manufactured by VG Scientific, England, which was operated at an accelerating voltage of 10 kV and a sample current of 20 nA. The results are shown in FIG. 1.

As is obvious from FIG. 1, the wire of Example 1 had a carbon layer to the depth of about 8 nm with atmospheric sulfur (S) adhered to the surface. Oxygen was also detected, which proved that calcium (Ca) in the silver-gold alloy formed an oxide. It was also found that penetration of sulfur (S) and oxygen stopped at the gold (Au)-enriched layer at its peak of about 8 nm. Detailed examination of the curves of gold (Au) and silver (Ag) proved that the proportion (atom %) of gold (Au) to silver (Ag) on the surface was the same as the proportion (atom %) of gold (Au) to silver (Ag) at the depth of about 25 nm or greater.

The wire was etched in the depth direction from the surface at a rate of 18 nm per minute and was then subjected to qualitative analysis of silver (Ag) on the same apparatus to give the same results as in FIG. 1.

The semi-finished silver-gold alloy wire with a diameter of about 2 mm of Examples 1 to 6 in Table 1 was subjected to wet continuous drawing in the atmosphere into a predetermined diameter of 20 μm and then to tempering heat treatment at 500° C. to give a silver-gold alloy bonding wire with percent elongation of 4%.

The resulting silver-gold alloy bonding wire was evaluated for smooth unwinding and adhesion to a molding resin, as follows. The results of evaluation are shown in the right columns of Table 1.

Figure 2:
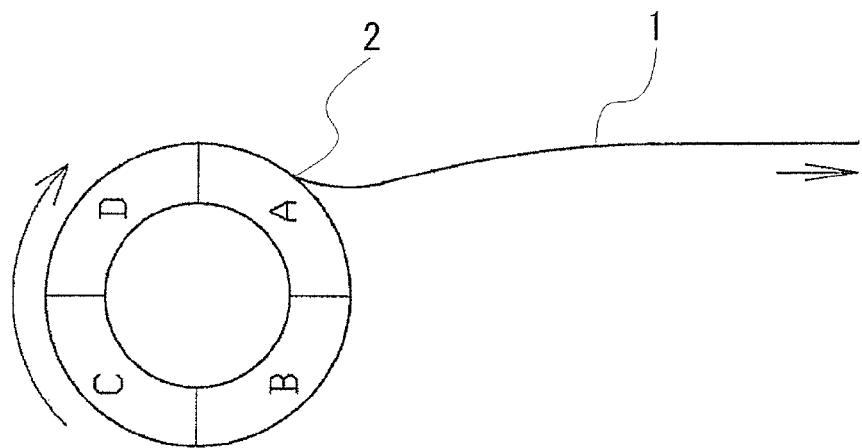
FIG. 2 shows smooth unwinding of a bonding wire.
Figure 3:
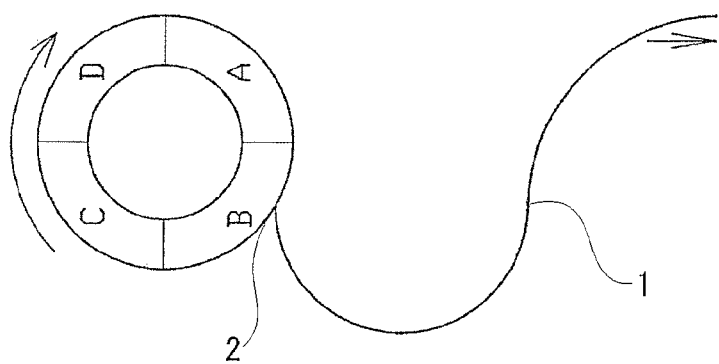
FIG. 3 shows unsmooth unwinding of a bonding wire.

Test to evaluate smooth unwinding of wire:

A bonding wire having a composition shown in the left columns of Table 1 was wound around a spool (50 mm in diameter), which was then rotated at a speed of 9 rotations per minute for 15 minutes so as to unwind and hang the bonding wire from a height of 30 cm. The position at which the bonding wire left the spool was used as an indicator in evaluating smooth unwinding of the bonding wire; Good when the position (2) at which the bonding wire (1) left the spool was within the area A as in FIG. 2 and Very Poor when the position (2) at which the bonding wire (1) left the spool was within the area B to the area D as in FIG. 3. Each evaluation was carried out for 5 samples (N=5).

Test to evaluate adhesion to molding resin:

An Al pad to simulate a semiconductor was mounted on a silver (Ag)-plated Fe—Ni alloy lead frame having 20 peripheral leads, followed by FAB bonding of a bonding wire having an alloy composition as in the left columns of Table 1 using a general-purpose bonder (model: UTC-1000) manufactured by Shinkawa Ltd. First ball bonding was performed in which a molten ball with a diameter of 40 μm was formed to give adherence at an area of 50 μm in diameter, followed by second bonding by ultrasonic bonding at a substrate temperature of 150° C. and an ultrasonic power of 0.25 W for 10 milliseconds with predetermined loopings created during the second bonding. Then, the simulated semiconductor chip and the lead frame were packaged using a commercially available silicone resin for LEDs. The resulting resin-molded workpiece was subjected to 1000 cycles of 150° C./−55° C. heating cycle test, followed by breaking the molding resin to observe the extent of spoiled second bonding, if any. The right column of Table 1 shows the spoiled rate (N=200); 0% as Excellent, not higher than 1% as Good, and not lower than 1% and lower than 3% as Poor.

TABLE 1

|  | Ag | Au (% by mass) | Ca (ppm by mass) | Smooth unwinding | Thermal shock test |
|---|---|---|---|---|---|
| Example 1 | Balance | 20 | 50 | Good | Excellent |
| Example 2 | Balance | 17 | 85 | Good | Excellent |
| Example 3 | Balance | 12 | 55 | Good | Excellent |
| Example 4 | Balance | 24 | 35 | Good | Good |
| Example 5 | Balance | 21 | 45 | Good | Good |
| Example 6 | Balance | 28 | 65 | Good | Good |
| Comp. Ex. 1 | Balance | 8 | 120 | Very Poor | Poor |
| Comp. Ex. 2 | Balance | 32 | 25 | Very Poor | Poor |

Comparative Examples 1 and 2

The composition of Comparative Examples in which gold (Au) and calcium (Ca) were outside the ranges of the compositions in Examples is shown in the left columns of Table 1. A silver-gold alloy ultra-fine wire of Comparative Example was subjected to final heat treatment in the same manner as in Examples at the time when the wire diameter reached 15 μm so as to adjust the percent elongation at 4%, followed by evaluation in the same manner as in Example 1. The results are shown in the right columns of Table 1. In Comparative Example 1 and Comparative Example 2, breakages were observed at the ball neck and in the vicinity of the boundary between the ball neck and the unrecrystallized part and were also observed at a high frequency at the area bonded by second bonding.

As is evident from the results, the silver-gold alloy bonding wire of the present invention with the composition within the predetermined range had excellent percent elongation at a high temperature and gave satisfactory results under a harsh environment with repeated heating cycles. The silver-gold alloy bonding wire of the present invention with the composition within the predetermined range also gave excellent results in smooth unwinding of the bonding wire.

INDUSTRIAL APPLICABILITY

The silver-gold alloy bonding wire of the present invention has an application field where the bonding wire undergoes repeated heating cycles, for example, in light-emitting diodes, flip-chip packages, and devices that include lead-free solder. The silver-gold alloy bonding wire of the present invention has another application field where the bonding wire undergoes harsh thermal shock, for example, in the devices as mentioned above, thermoelectric apparatuses, and vehicle-mounted semiconductor substrates. Thus, the silver-gold alloy bonding wire of the present invention will greatly contribute to the field of technique in fabrication of semiconductor apparatuses.

REFERENCE SIGNS LIST

1: Bonding wire
2: Position at which wire left spool

What is claimed is:

1. A silver-gold alloy bonding wire, comprising:
an alloy composed of not lower than 10% and not higher than 30% of gold (Au), and not lower than 30 ppm and not higher than 90 ppm of calcium (Ca) with a remainder of silver (Ag) at purity relative to a metallic element except for elements Au and Ca of 99.99% or higher, in mass percentage,
a layer enriched with oxygen and calcium (Ca) formed as a surface layer on a surface of the alloy, and
a gold-enriched layer formed immediately below the surface layer.

2. The silver-gold alloy bonding wire according to claim 1, wherein the gold (Au) is not lower than 15% and not higher than 25% in mass percentage.

3. The silver-gold alloy bonding wire according to claim 1, further comprising a carbon layer immediately over the surface layer.

4. The silver-gold alloy bonding wire according to claim 1, wherein a gold (Au) content in the gold-enriched layer is higher than a gold (Au) content in the surface layer by 10% or more.

5. The silver-gold alloy bonding wire according to claim 1, wherein a thickness of the surface layer is smaller than 10 nm.

* * * * *